United States Patent [19]

De Witt et al.

[11] 3,860,454

[45] Jan. 14, 1975

[54] FIELD EFFECT TRANSISTOR STRUCTURE FOR MINIMIZING PARASITIC INVERSION AND PROCESS FOR FABRICATING

[75] Inventors: David De Witt, Poughkeepsie; William S. Johnson, Hopewell Junction, both of N.Y.

[73] Assignee: International Business Machines Corporation, Armonk, N.Y.

[22] Filed: June 27, 1973

[21] Appl. No.: 374,152

[52] U.S. Cl. ...................... 148/1.5, 357/41, 357/52, 357/91

[51] Int. Cl. ............................................ H01l 7/54

[58] Field of Search ............ 148/1.5, 187; 317/234, 317/235

[56] References Cited

UNITED STATES PATENTS

| | | | |
|---|---|---|---|
| 3,383,567 | 5/1968 | King et al. | 317/234 |
| 3,461,361 | 8/1969 | Delivorias | 317/235 |
| 3,617,391 | 11/1971 | Lepselter et al. | 148/1.5 |
| 3,666,548 | 5/1972 | Brack et al. | 148/1.5 UX |
| 3,789,504 | 2/1974 | Jaddam | 148/187 |

*Primary Examiner*—C. Lovell
*Assistant Examiner*—J. M. Davis
*Attorney, Agent, or Firm*—Wolmar J. Stoffel

[57] ABSTRACT

A process for fabricating a field effect transistor having minimal parasitic inversion wherein a field layer of insulating material is formed on a monocrystalline substrate having spaced source and drain regions, an opening formed in the field layer over the gate region, and the body bombarded with impurity ions of the same type as the background doping of the semiconductor body, the bombarding done at an energy sufficient to traverse the field insulation layer to produce an increased concentration of impurity ions just beneath the interface of the semiconductor body and field oxide, and a buried layer of impurity in the gate region.

7 Claims, 6 Drawing Figures

FIELD EFFECT TRANSISTOR STRUCTURE FOR MINIMIZING PARASITIC INVERSION AND PROCESS FOR FABRICATING

BACKGROUND OF THE INVENTION

1. Field of the Invention

This invention relates to improved field effect transistor structures and, more particularly, to a structure and method for minimizing parasitic inversion.

2. Description of the Prior Art

The metal oxide semiconductor field effect transistor is a well-known type of device operating by flow of majority charge carriers. The field effect transistor has spaced source and drain regions of low resistivity doped with a first type impurity for semiconductors in a single crystal semiconductor material having a high resistivity due to a low concentration of an opposite second type background impurity for semiconductors. A conduction channel is thereby provided between the source and drain regions. The field effect transistor includes a control or gate structure for controlling the flow of majority charge carriers through the channel consisting of a thin film of insulation adjacent the channel and a metal or other conductive gate electrode over the insulating film. Appropriate circuit connections are made to the source, drain and gate electrodes.

The relative simplicity of fabrication and its circuit characteristics make field effect transistors very attractive for use in integrated circuit devices of the monolithic semiconductor type, particularly for computer applications.

During operation of integrated circuit devices utilizing FET's voltages and currents are conducted by means of interconnections provided between the devices. The interconnection system consisting of one or more metallurgy stripes is separated from the semiconductor body by a relatively thick layer of field insulation. The voltages in the interconnection system cause electrical fields and charges to build up in, on, and about the surface of the substrate and the overlying protective field insulation layer, which in turn give rise to unwanted parasitic conduction paths along and near the device surface. Parasitic inversion of the field regions of field effect transistors in integrated circuit devices is a common and serious problem, particularly in N channel type devices, which leads to current leakage. When parasitic conduction paths are allowed to extend from one active device to another, unwanted shorts and even catastrophic failures result. To control parasitic inversion, various methods are known in the prior art to control and prevent the spread of unwanted inversion. One technique is to provide special regions of increased conductivity at selected locations within the substrate in order to interrupt the inversion paths. These regions, usually formed by diffusion, are known as channel stops and are of the same conductivity as the substrate but with a higher surface concentration. Although satisfactory for some applications, the channel stop regions take up a relatively large portion of the available surface area thereby imposing serious restraints on the degree of miniaturization that can be achieved. For high density integrated circuits or complex arrays in which many field effect transistors are fabricated together in a small area on the substrate, the channel stop solution is unsatisfactory. Since parasitic inversion of the substrate surface is in general inversely proportional to insulating layer thickness, unwanted parasitic inversion can also be reduced by increasing the thickness of the insulating layer. However, it is frequently impractical to increase the protective layer thickness to the extent necessary to control parasitic inversion due to fabricating difficulties, for example, the difficulty of subtractively etching a relatively thick layer to very small geometries. Also, thick protective layers may develop contamination problems causing the electrical characteristics of the device to drift over a period of time. Another technique that has been suggested for controlling inversion is to imbed conductive layers in the field dielectric beneath the interconnection layers that are connected to the body of the device. This technique also as its limitations since it requires additional fabricating process steps demanding additional masking, etching and aligning steps which, in general, decrease the overall yield of the device.

Another technique which has been suggested is to increase the impurity concentration in the field regions by a diffusion or ion bombardment. The techniques known to the prior art for increasing the impurity concentration require additional masking and etching steps, as well as heating steps which cause device yield loss due to the probability of inherent misalignments and movement of the diffusions within the device.

A means for controlling unwanted inversion along the substrate surface of an FET device is therefore needed that does not reduce available surface area, does not interfere with subsequent processing steps, does not increase the oxide thickness above a practical limit, and does not increase the turn-on voltage.

SUMMARY OF THE INVENTION

An object of this invention is to minimize parasitic inversion in the field regions of a field effect transistor.

Another object of this invention is to provide a method for increasing the surface concentration of a field effect transistor without requiring additional masking and alignment steps.

Yet another object of this invention is to provide a method for increasing the punch-through voltage of the source and drain regions.

Yet another object of this invention is to provide an FET structure in which parasitic inversion is minimized.

These and other objects of the invention are accomplished by a process for forming field effect transistors which includes the steps of forming on the surface of a doped monocrystalline semiconductor body a layer of insulating material, forming an opening in the layer exposing at least the gate region of the ultimate field effect transistor, bombarding the surface of the body with impurity ions of the same type as the dopant in the body at an energy sufficient to penetrate field insulation layer to thereby produce an increased concentration of impurity in the semiconductor body just beneath the interface of the field insulation layer and the upper surface of the body, and produce a buried layer of impurity in the gate region that does not interfere with the operation of the device and also increases the punch-through voltage of the source and drain region.

BRIEF DESCRIPTION OF THE DRAWINGS

The foregoing and other objects, features and advantages of the invention will be apparent from the following more particular description of preferred embodiments of the invention as illustrated in the accompanying drawings wherein FIGS. 1, 2 and 4 are a sequence of elevational views in broken section that illustrate the structure of the device in various stages of fabrication and wherein FIG. 2 is a view taken on line 2—2 of FIG. 3 and FIG. 4 is a view taken on line 4—4 of FIG. 3.

DESCRIPTION OF THE PREFERRED EMOBIMENTS

Figure 1:
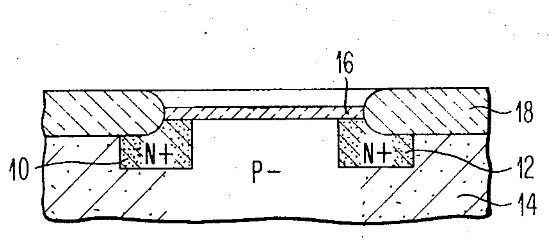

Referring now to the FIGURES of the drawing, in particular FIG. 1, there is illustrated low resistivity source and drain regions 10 and 12 formed by introducing an N-type impurity for semiconductors into a monocrystalline semiconductor body 14, having a low resistivity due to a low concentration of a P-type impurity for semiconductors. Regions 10 and 12 can be formed by any suitable technique, as for example, diffusion or ion implantation. In the preferred embodiment illustrated, a layer 16 of $Si_3N_4$ is deposited over the gate region and a relatively thick layer 18 of thermal $SiO_2$ grown. No oxide is formed in the gate region since the underlying silicon is prevented from being oxidized by layer 16 of $Si_3N_4$. Layer 18 constitutes the field insulating layer and in general overlies all of the regions of the body not occupied by active field effect transistors. Layer 18 is any suitable thickness, typically from 1,000 to 20,000 Angstroms, more preferably from 5,000 to 10,000 Angstroms. It should be understood that the field insulation layer 18 can be produced by other techniques, as for example, pyrolytic deposition, RF sputter deposition, anodization, and the like. Still further, field insulating layer 18 can be of any suitable type of material or combination of materials, as for example, $Al_2O_3$, $Si_3N_4$, or composite layers of $Si_3N_4$and $SiO_2$, and the like. Gate dielectric layer 16 can also be of materials other than $Si_3N_4$, as for example, $SiO_2$, $Al_2O_3$, or combinations of known insulating layers. Thickness of layer 16 is significantly less than the thickness of field insulating layer 18 and is commonly in the range of 100 to 1,000 Angstroms. Still further, the invention is applicable to either N channel or P channel field effect transistor devices. Thus, the source and drain regions could be formed with a high concentration of P-type impurities for semiconductors and the body provided with a background doping of N-type impurity.

Figure 2:
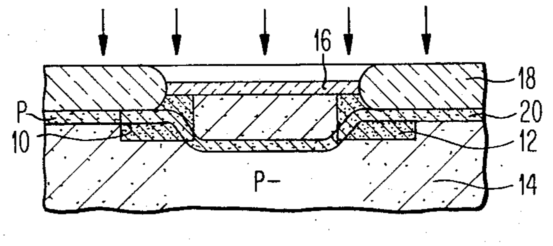
Figure 3:
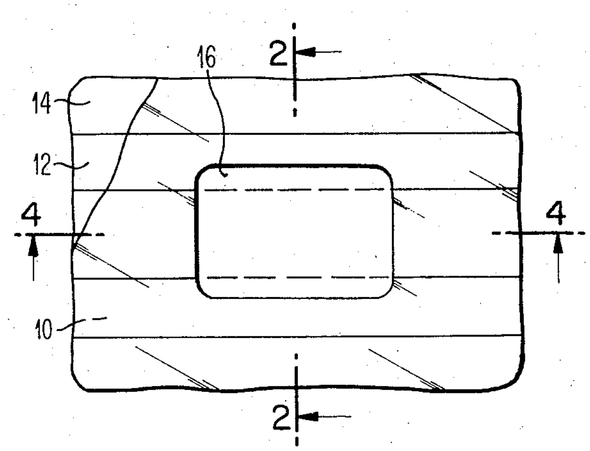
FIG. 3 is a top plan view of the field effect transistor.

As shown in FIG. 2, the body is subsequently subjected to a blanket ion bombardment by an impurity of the same type as the background impurity of body 14 of the semiconductor. In the preferred embodiment, boron ions are used to bombard the semiconductor at a suitable energy sufficient to produce a region 20 which in the field region just underlies the field insulating layer. The region 20 is typically on the order of 2,000 Angstroms in thickness and preferably has an impurity concentration, including the background doping of body 14, on the order of $10^{17}$ atoms/cc, more generally, $10^{16}$ to $5 \times 10^{17}$ atoms/cc. This represents a very significant increase in impurity concentration over the background impurity concentration of the body which is conventionally in the range of $2 \times 10^{12}$ to $7 \times 10^{15}$ atoms/cc, more generally, $10^{14}$ to $10^{15}$ atoms/cc. As illustrated in FIG. 2, region 20 underneath the gate lies at a significant depth below the surface. In general, the depth of the region 20 under the gate is approximately the thickness of the field insulating layer less the thickness of the gate insulating layer 16. The energy imparted to the ions in the bombardment step will depend on the thickness of the field insulating layer 18 and the nature of the oxide, i.e. the degree that the ions are slowed up in passing through the oxide. As is believed obvious, if the process is applied to a P channel field effect transistor, the ions used in the bombardment step are of the same type as the background impurity of the semiconductor body. Thus, in fabricating a P channel field effect transistor, the ions would be of an N-type impurity, typically phosphorous.

Figure 5:
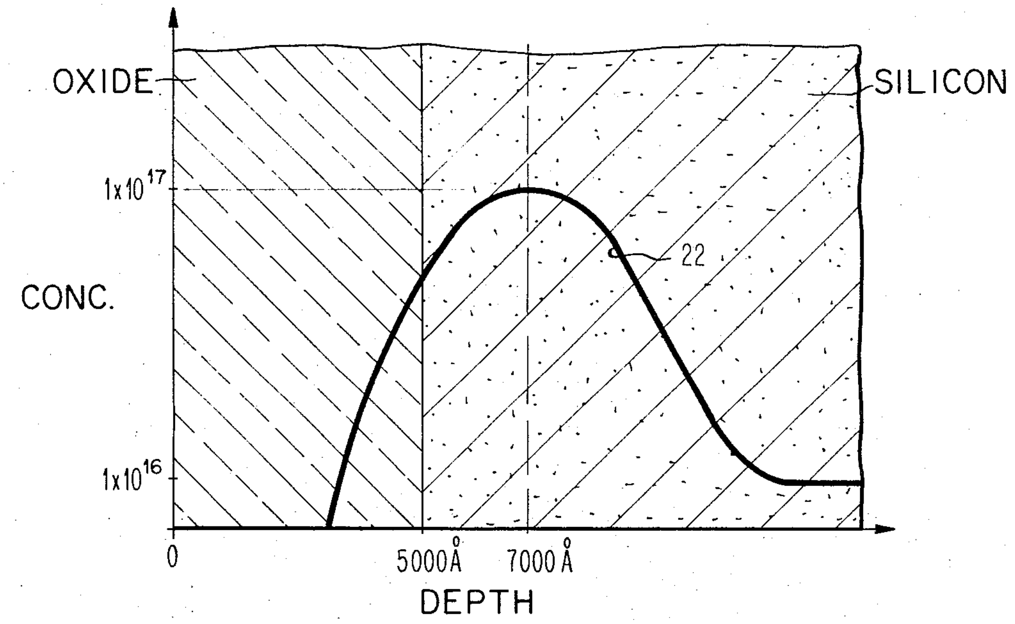
FIG. 5 is a graph of impurity concentration versus depth which depicts the impurity profile in the field regions of the device.

Referring now to FIG. 5, there is depicted by curve 22, the impurity profile produced by the bombardment in the field region of the device. Note, that the peak concentration occurs approximately 1,000 Angstroms beneath the oxide-semiconductor body interface.

Figure 4:
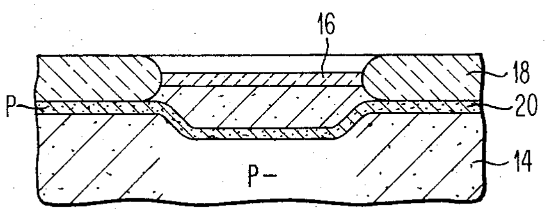
Figure 6:
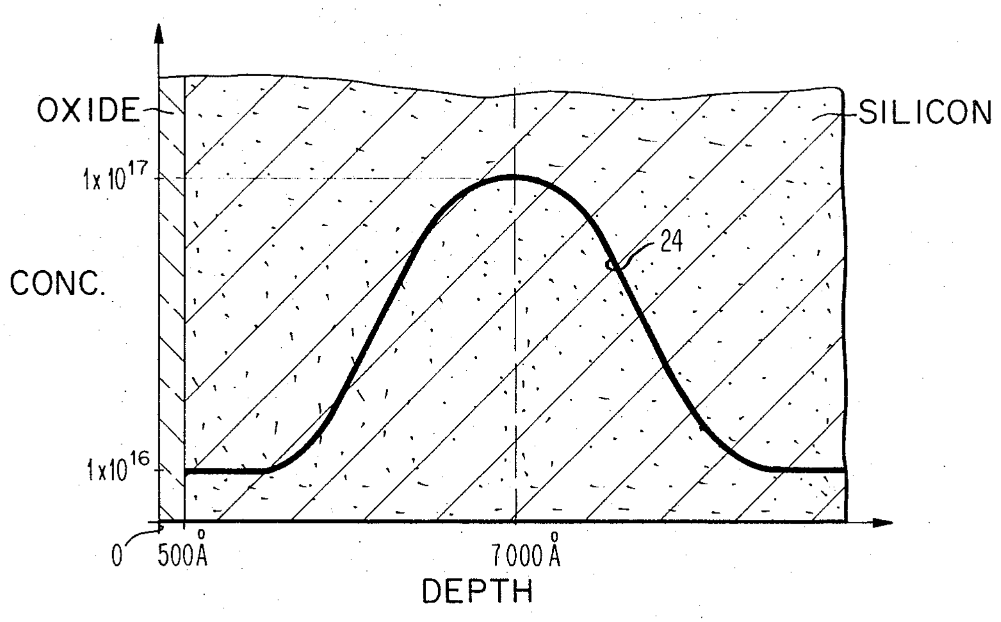
FIG. 6 is a graph depicting the impurity profile in the gate region of the FET device.

Referring now to FIG. 6, curve 24 depicts the impurity profile produced by the ion bombardment step in the region underlying the gate. Note that the peak impurity concentration lies approximately 7,000 Angstroms beneath the surface of the oxide, or in the same relative position as the impurity peak in the field region. It has been demonstrated that region 20 at such depth under the gate electrode does not significantly affect the device operation and also has the additional advantage of increasing the punch-through voltage of the source and drain regions. This is a significant consideration when one appreciates the fact that in microminiaturized devices, the source and drain are being increasingly positioned closer together. When the source and drain regions are back-biased as occurs in operation, the depletion regions surrounding the source and drain may meet. When this condition occurs, current flows and a phenomenon known as punch-through occurs. The device in this condition is non-functional. The presence of region 20 of a higher concentration has the effect of reducing the width of the depletion regions thereby increasing the voltage at which punch-through will occur. The impurity concentration of region 20 is chosen to make the layer underlying the field region sufficiently P-type in an N channel FET to be effective against inversion but not so high as to produce a P channel which would result in low drain to substrate breakdown voltages. The view in FIG. 4 is provided to illustrate the location of region 20 in the gate region along the line that does not intersect the source and drain regions. The device is subsequently completed by providing source and drain and gate electrodes and the necessary interconnection metallurgy utilizing known conventional techniques to deposit terminals and passivating structure. Since these steps are not part of the invention, they are not illustrated or described in detail.

An important advantage of the process and the structure of this invention is that the bombardment step required to form region 20 does not require an additional masking step. Rather, the bombardment is done at a critical time in the fabrication process, namely after the oxide has been formed and the gate opening made. The bombardment could conceivably be made with or without the gate insulation layer in place. Since no masking step is required, the necessity for a critical mask alignment operation is eliminated. This factor should increase the yield since the probability of forming defects due to mask alignment and mask defects per se is decreased. Further, since the device is handled less than in conventional processes, the danger from contamination is also decreased. In general, the ion bombardment step must be done after the source and drain diffusions are made. If the source and drain diffusions were made subsequent to bombardment by diffusion requiring a high temperature processing step, the gate region 20 is likely to move about and the probability of producing bad devices is enhanced. However, alternate processes wherein the source and drain are formed by ion implantation could be devised and the blanket ion bombardment thereby precedes the formation of the source and drain regions.

The following examples are included to illustrate specific techniques for fabricating the device of the invention and are not intended to unduly limit the practice thereof.

EXAMPLE I

A silicon wafer having a resistivity of 2 ohm cm. with a background boron doping of a concentration of $7 \times 10^{15}$ atoms/cc, with a crystalline orientation, as defined by the Miller indices, of a <100 > was selected. The surface of the wafer was thermally oxidized forming a layer of $SiO_2$ having a thickness on the order of 5,000 Angstroms. Using conventional photolithographic techniques, a plurality of openings were made in the oxide to serve as source and drain windows. Phosphorous was diffused into the masked wafer through the source and drain openings by conventional techniques, producing a surface concentration of $10^{21}$ atoms/cc. The wafer was then reoxidized to form a layer of $SiO_2$ in the source and drain regions, having a thickness of approximately 5,000 Angstroms and adding approximately 2,000 additional Angstroms of $SiO_2$ on the field regions. Using conventional photolithographic and masking techniques, openings were formed over approximately one-half of the gate regions, i.e. the area between the source and drain. The wafer was then oxidized to form approximately 500 Angstroms of $SiO_2$ as a thin gate oxide. At this point, one-half of the wafer was covered with a metal plate and the wafer exposed to a blanket boron ion bombardment. The dosage of the bombardment was $2 \times 10^{12}$ boron atoms/cm$^2$ at an energy of 300 KEV. The bombardment, energy and dosage was calculated to produce a layer region 2,000 Angstroms thick with a peak concentration of boron on the order of $6 \times 10^{16}$ atoms/cc. The energy was selected so that the resultant region of boron impurity penetrated the field oxide layer. The half of the wafer covered by the metal plate did not receive any bombardment since it was masked. The wafer was then annealed at 900°C in nitrogen for 20 minutes to heal the damage resulting from the bombardment. Contact openings were subsequently made to the source and drain regions by using conventional photolithographic and masking techniques. A blanket layer of aluminum having a thickness of 10,000 Angstroms was then deposited on the surface of the wafer and the layer subetched to produce electrical contacts to all the source and drain regions and a set of gate electrodes over the thin gate oxide between sets of source and drains, as well as a second set of electrodes between adjacent source and drain regions utilizing the thick field oxide as a gate oxide. The device was then heated at 400°C for 20 minutes to sinter the aluminum. The resultant wafer therefore contained two sets of field effect transistors, one set having a 500 Angstrom gate oxide, and a second set with the gate over the field oxide. One-half of each of the sets of FET's had been exposed to an ion bombardment step to produce the region of increased conductivity near the interface of the body and field oxide layer. The remaining one-half of each of the sets was conventional FET's having no region of higher conductivity.

Selecting a plurality of test devices wherein the gate electrode was separated from the body of the device by the thick field layer, a 10 volt potential was applied between each of the source and drain regions on devices embodying the layer formed by bombardment, and also the devices not exposed to bombardment. The voltage on the respective gates was increased until a one milliamp current was induced between the source and drain. With the FET devices having no implanted region, it was noted that 5 volts was required to induce the desired current. In contrast with the devices having a buried region, an average value of 16 volts was required to produce the one milliamp current between the source and drain. The greater voltage required to form a channel through the thick oxide is an indication of the greater resistance to parasitic inversion produced by the buried layer produced by the above bombardment.

EXAMPLE II

Several devices on each side of the wafer were selected having the gate electrode separated from the gate region by a thin layer of insulation. The intent of the example was to determine whether or not the buried region in the gate region had any significant effect on device operation. On each of the devices selected, 0.1 volts were applied across the source and drain, and the gate voltage varied in increments between 0 and 5 volts. The current between the source and drain, i.e. the drain current, was measured and plotted versus the gate voltage. The curve was then extrapolated back to 0 drain current to determine the threshold voltage. The results indicated that both sets of FET's, one containing the buried layer and the other set without, displayed a threshold voltage of $0.48 \pm 0.06$ volts. There was no measurable difference between the two sets of devices. This is a positive indication that the operating characteristic of the FET is not adversely affected by the buried region in the gate region.

While the invention has been particularly shown and described with reference to the preferred embodiments thereof, it will be understood by those skilled in the art that the foregoing and other changes in form and detail may be made therein without departing from the spirit and socpe of the invention.

What is claimed is:

1. A process for fabricating a field effect transistor having minimal parasitic inversion comprising forming a field layer of insulating material on the surface of a monocrystalline semiconductor body embodying a first type impurity for semiconductors and having spaced regions of a second opposite type impurity, forming an opening in said field layer, exposing at least the gate region of the ultimate field effect transistor, forming a gate insulating layer of material in said opening of a thickness significantly less than the thickness of said field layer, bombarding the surface of said body with impurity ions of a first type at an energy sufficient to penetrate said field insulation layer to produce an increased concentration of impurity ions just beneath the semiconductor body, field insulation layer interface, and a buried layer of impurity in the gate region, and forming electrical contacts on the resultant device.

2. The method of claim 1 wherein said field layer is $SiO_2$ formed by thermally oxidizing said semiconductor body.

3. The method of claim 2 wherein said field layer has a thickness in the range of 1,000 to 20,000 Angstroms.

4. The method of claim 1 wherein said gate insulating layer has a thickness in the range of 100 to 1,000 Angstroms.

5. The method of claim 1 wherein the semiconductor body has a background impurity concentration in the range of $10^{14}$ to $10^{15}$ atoms/cc.

6. The method of claim 5 wherein the average impurity concentration of the resultant bombarded layer is in the range of $10^{16}$ to $10^{19}$ atoms/cc.

7. A process for fabricating a field effect transistor having minimal parasitic inversion comprising forming a field layer of insulating material on the surface of a monocrystalline semiconductor body embodying a first type impurity for semiconductors and having spaced regions of a second opposite type impurity, forming an opening in said field layer, exposing at least the gate region of the ultimate field effect transistor, bombarding the surface of said body with impurity ions of a first type at an energy sufficient to penetrate said field insulation layer to produce an increased concentration of impurity ions just beneath the semiconductor body, field insulation layer interface, and a buried layer of impurity in the gate region, forming a gate insulating layer of material in said opening of a thickness significantly less than the thickness of said field layer, and forming electrical contacts on the resultant device.

* * * * *